United States Patent [19]

Huang et al.

[11] Patent Number: 5,049,962
[45] Date of Patent: Sep. 17, 1991

[54] CONTROL OF OPTICAL CROSSTALK BETWEEN ADJACENT PHOTODETECTING REGIONS

[75] Inventors: Chao Huang, Goleta; Paul R. Norton, Santa Barbara, both of Calif.

[73] Assignee: Santa Barbara Research Center, Goleta, Calif.

[21] Appl. No.: 490,011

[22] Filed: Mar. 7, 1990

[51] Int. Cl.$^5$ .................... H01L 27/14; H01L 29/06; H01L 27/10
[52] U.S. Cl. ........................ 357/30; 357/20; 357/32; 357/45; 357/47; 357/49; 357/55
[58] Field of Search ............... 357/30 B, 30 D, 30 G, 357/30 H, 30 P, 30 Q, 30 R, 20, 32, 45, 47, 49, 55

[56] References Cited

U.S. PATENT DOCUMENTS

| | | |
|---|---|---|
| 3,677,280 | 7/1972 | Weckler . |
| 3,794,891 | 2/1974 | Takamiya ...................... 317/235 R |
| 3,845,494 | 10/1974 | Ameurlaine et al. . |
| 3,858,306 | 1/1975 | Kloek et al. . |
| 3,988,774 | 10/1976 | Cohen-Solal et al. . |
| 4,053,919 | 10/1977 | Andrews, II et al. ............ 357/30 B |
| 4,105,478 | 8/1978 | Johnson . |
| 4,132,999 | 1/1979 | Maille et al. . |
| 4,206,003 | 6/1980 | Koehler . |
| 4,411,732 | 10/1983 | Wotherspoon . |
| 4,532,699 | 8/1985 | Bourdillot et al. . |
| 4,639,756 | 1/1987 | Rosbeck et al. ........................ 357/30 |
| 4,646,120 | 2/1987 | Hacskaylo ............................. 357/30 |
| 4,652,899 | 3/1987 | Hoeberechts ......................... 357/29 |
| 4,717,946 | 1/1988 | Godfrey ................................ 357/30 |
| 4,766,084 | 8/1988 | Bory et al. . |
| 4,868,622 | 9/1989 | Shigenaka ......................... 357/30 B |

FOREIGN PATENT DOCUMENTS

| | | |
|---|---|---|
| 55-27657 | 2/1980 | Japan ................................. 357/30 D |
| 57-92877(A) | 6/1982 | Japan . |
| 60-157273 | 8/1985 | Japan . |
| 62-119976 | 6/1987 | Japan .................................. 357/30 B |
| 2100927(A) | 1/1983 | United Kingdom . |

OTHER PUBLICATIONS

"Backside-Illuminated HgCdTe/CdTe Photodiodes", M. Lanir et al., Appl. Phys. Lett. 34(1) 1 Jan. 1979.
"Mercury Cadmium Telluride as an Infrared Detector Material", E. Stelzer et al., IEEE Transactions on Electron Devices, Oct. 1969.
"CdTe-HgTe Heterostructures", G. Almasi et al., Journal of Applied Physics vol. 19, No. 1 Jan. 1968.

Primary Examiner—Jerome Jackson, Jr.
Assistant Examiner—Ngan Van Ngo
Attorney, Agent, or Firm—W. C. Schubert; W. K. Denson-Low

[57] ABSTRACT

An array [10] of photodetecting active regions [16] includes a layer of photoresponsive material [14] differentiated into a plurality of photodetecting active regions. The layer has a composition which varies across a thickness of the layer from a first surface of the layer to a second surface [14a] of the layer such that a magnitude of an effective energy bandgap of the layer decreases from the first surface to the second surface. A resulting crystal potential field constrains photoexcited minority charge carriers to exist within a region of the layer which is substantially adjacent to the second, narrower energy bandgap surface. The array further includes a plurality of groove structures [18] formed within the second surface of the layer and extending into the layer to a depth less than the thickness of the layer. A groove is interposed between at least two adjacent active regions for substantially preventing minority carriers from laterally diffusing between active regions. The grooves may be combined with ground plane or guard diode structures, each limiting the diffusion of minority charge carriers along a respective axis. The photodetecting active regions may each comprise a reduced area p-n juntion.

21 Claims, 2 Drawing Sheets

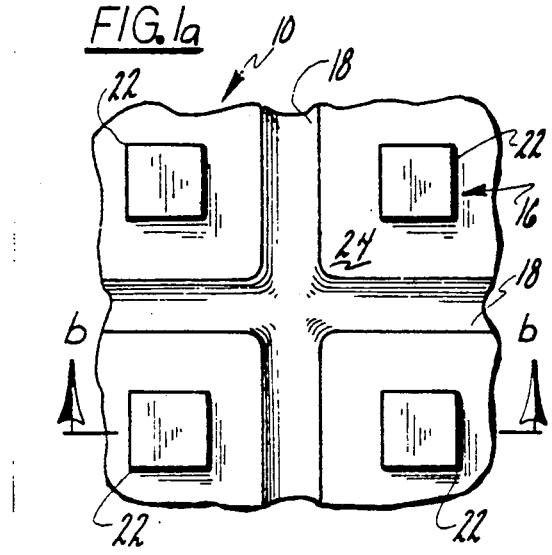
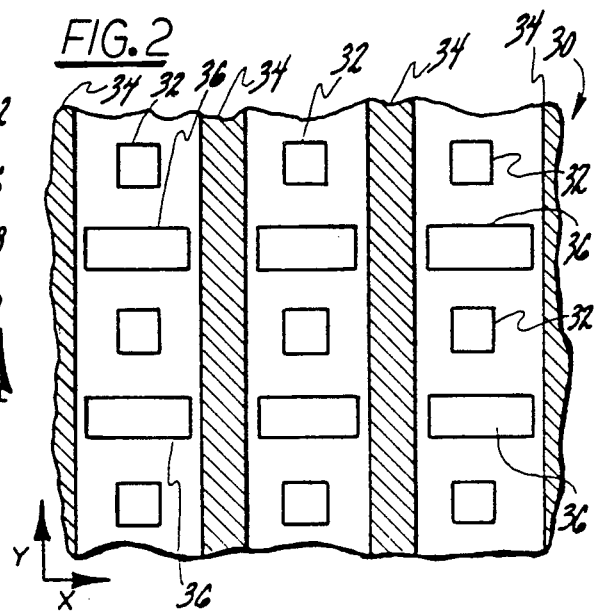
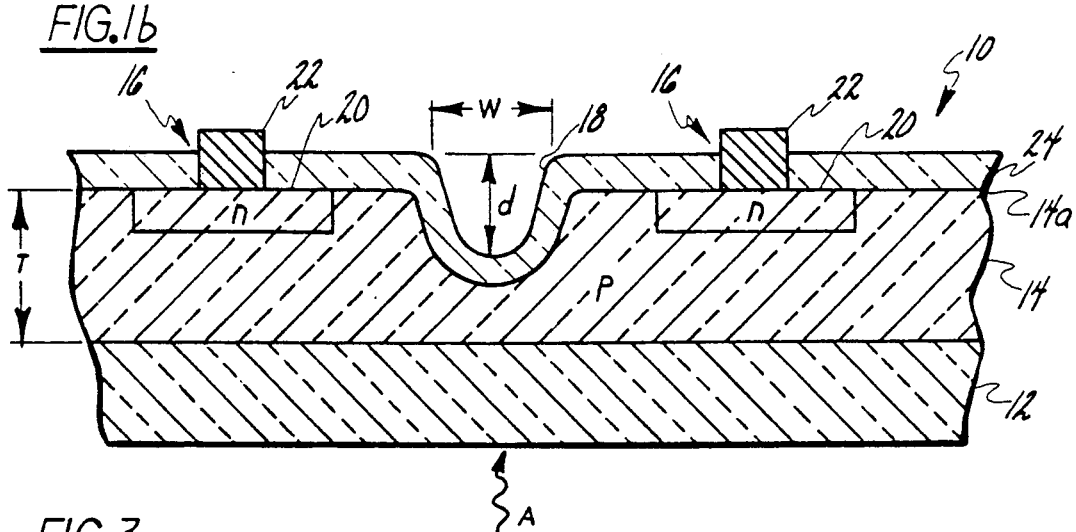
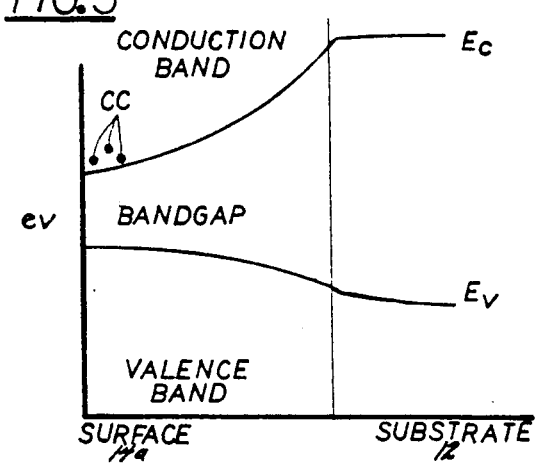

CONTROL OF OPTICAL CROSSTALK BETWEEN ADJACENT PHOTODETECTING REGIONS

FIELD OF THE INVENTION

This invention relates generally to radiation detectors and, in particular, relates to arrays of radiation detectors constructed of a graded bandgap photodetecting layer having grooves etched between adjacent photodetectors for substantially preventing optical crosstalk between photodetectors.

BACKGROUND OF THE INVENTION

A particular problem associated with arrays of radiation detectors relates to controlling the lateral collection of photoexcited charge carriers, electrons or holes, such that carriers created by photons in the vicinity of the active area of one photodetector are not collected by an adjacent photodetector. Photoexcited charge carriers are known to "random walk" while diffusing laterally through a layer of semiconductor material until they are collected by an active detector region. This results in a charge carrier being collected by an active detector region which may be located a significant distance away from the point of origin of the charge carrier. The end result is a form of signal noise resulting from optical crosstalk between the detectors.

The above problem is of particular concern in a detector array in which the detector active areas are reduced in size in order to maximize detector impedance and to minimize detector capacitance. In this case relatively large, open "inactive" areas may exist in which photoexcited carriers can diffuse before being collected by the depletion layer of an active detector.

The diffusion process can be described as taking the charge carrier on a random walk between its point of origin and an arbitrary final location. The net diffusion length is a function of the semiconductor material temperature, charge carrier lifetime and charge carrier mobility. An isolated active detector region typically collects charge carriers which have been created by photoabsorption up to approximately a diffusion length away. Depending upon the thickness of the detector material in relation to the diffusion length and other factors, the diffusion process may be considered to occur in two or in three dimensions.

Several conventional approaches to controlling optical crosstalk operate by reducing the probability of charge carrier diffusion to a nearest active detector. These conventional approaches include the provision of groundplanes or guard diodes which themselves collect the charge carriers. Unfortunately, such techniques destroy a percentage of the charge carriers in the process of preventing optical crosstalk. If the charge carriers are destroyed the nearest active detector is unable to collect them as a signal current, thereby decreasing the efficiency of the detector.

The following references discuss aspects of reducing photodetector active area and/or reducing photodetector junction capacitance: U.S. Pat. No. 4,717,946, Jan. 5, 1988 to Godfrey entitled "Thin Line Junction Photodiode", U.S. Pat. No. 4,652,899, Mar. 4, 1987 to Hoeberechts entitled "Radiation-Sensitive Semiconductor Device Having Reduced Capacitance", U.S. Pat. No. 3,794,891, Feb. 26, 1974 to Takamiya entitled "High Speed Response Phototransistor and Method of Making the Same" and Japan Appl. No. 56-113769, June 9, 1982 entitled "Photo-Receiving Semiconductor".

Commonly assigned in U.S. Pat. No. 4,639,756, Jan. 27, 1987 to Rosbeck et al. entitled "Graded Gap Inversion Layer Photodiode Array" describes a mesa-type array of photodiodes wherein grooves extend completely through a radiation absorbing layer 16 and into an underlying buffer layer 14 such that photocarriers cannot readily move to neighboring diodes (col. 6, lines 18–30). In U.S. Pat. No. 4,646,120, Feb. 24, 1987, entitled "Photodiode Array" Hacskaylo describes, in relation to the prior art (FIG. 1), grooves 6 and 7 that extend only partially through a radiation absorbing layer 2. However, this arrangement is said to suffer from cross-talk.

UK Patent Application No. 2,100,927A, published Jan. 6, 1983 by A. B. Dean et al. and entitled "Photo Diodes" describes an array of photodiodes fabricated over a p-type $Cd_xHg_{1-x}Te$ substrate. The array includes a CdTe layer that overlies the substrate and into which individual photodiodes are formed. A heating process is said to cause a gradual material composition change creating a graded heterostructure where the p-n junction is close to the heterojunction.

However, none of these references teach the advantages made possible by providing an array of radiation detecting devices formed within a radiation absorbing layer having a varying composition and energy bandgap, the individual devices being differentiated one from another with grooves and possibly other structure that extend only partially into the radiation absorbing layer.

SUMMARY OF THE INVENTION

The foregoing problems are overcome and other advantages are realized in an array of photodetectors constructed and operated in accordance with the invention wherein the probability is increased that a charge carrier will diffuse to a nearest active detector region while simultaneously reducing the probability that the charge carrier will diffuse to an adjacent detector region.

In accordance with the invention there is disclosed an array of -photodetecting active regions, the array including a layer of photoresponsive material differentiated into a plurality of -photodetecting active regions. The photodetecting active regions, in an embodiment of the invention, are p-n junctions having a reduced area and a corresponding reduced junction capacitance and increased junction impedance. The layer has a composition which varies across a thickness of the layer from a first surface of the layer to a second surface of the layer such that the magnitude of the effective energy bandgap of the layer decreases from the first surface to the second surface. A resulting crystal potential field constrains photoexcited charge carriers to exist within a region of the layer which is substantially adjacent to the second, narrower energy bandgap surface. The array further includes a plurality of groove structures formed within the second surface of the layer which extend into the layer to a predetermined depth which is less than the thickness of the layer. Individual ones of the groove structures are interposed between at least two adjacent ones of the active regions for substantially preventing a charge carrier from laterally diffusing from one of the active regions to an adjacent one of the active regions.

In one embodiment of the invention the groove structures are used alone to limit the lateral diffusion of charge carriers. In another embodiment of the invention the groove structures are combined with ground plane structures or guard diodes. The ground plane structures or guard diodes are preferably linearly shaped and limit charge carrier lateral diffusion along one axis while the groove structures are disposed at right angles to the ground plane or guard diode structures and limit lateral diffusion along a second axis.

BRIEF DESCRIPTION OF THE DRAWING

The above set forth and other features of the invention will be made more apparent in the ensuing Detailed Description of the Invention when read in conjunction with the attached Drawing, wherein:

FIG. 1a is a top view (not to scale) of a portion of a radiation detecting array 10;

FIG. 1b is cross-sectional view (not to scale) of the portion of the radiation detecting array 10 taken along the line b—b of FIG. 1a and showing two adjacent photodetecting active regions separated by a groove 18 which extends partially through a layer 14 of photodetecting material;

FIG. 2 is a top view (not to scale) of a portion of a radiation detecting array having a plurality of ground planes 34 disposed along a first axis and interposed between active regions and also a plurality of grooves 36 disposed along a second axis which is perpendicular to the first axis; and FIG. 3 is an energy band diagram showing the graded energy bandgap within the layer 14.

DETAILED DESCRIPTION OF THE INVENTION

Figure 4:
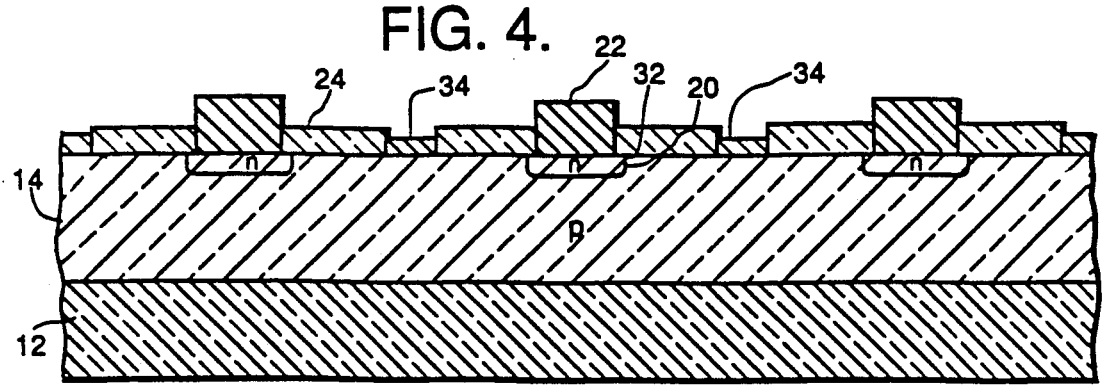
FIG. 4 is a cross-sectional view (not to scale) of the portion of the radiation detector array shown in FIG. 2 having a plurality of ground planes disposed along a first axis and interposed between active regions. Electrical terminals 22 for the active areas 32 and the passivation layer 24 similar to that shown in FIG. 1b have been added.

The teaching of the invention is especially applicable to a photodetecting structure in which the detector material is provided as a thin film, on the order of one to one hundred microns in thickness. The teaching of the invention is also applicable to photodetecting devices constructed of Group II-VI material, such as HgCdTe, or of Group III-V material, such as InGaAsP. As such, the following teaching is intended to be construed broadly and is not intended to be limited to only the examples and embodiments disclosed below.

Referring first to FIGS. 1a and 1b there is shown a top view and a cross-sectional view, respectively, of a portion of a radiation detecting array 10 including a substrate 12 and a layer of p-type photodetecting material 14 overlying the substrate 12. Radiation, designated by the arrow A, is shown incident on a back surface of the device although the teaching of the invention is also applicable to frontside illuminated devices. The layer 14 has an upper surface 14a having two adjacent photodetecting active regions 16 separated by, in accordance with the invention, a groove 18 which extends only partially through the layer 14 of photodetecting material. The groove 18 serves to physically isolate a charge carrier created near one active region 16 from diffusing to an adjacent active region 16. In accordance with an aspect of the invention the function of the groove 18 is facilitated by constructing the layer 14 as a compositionally graded layer such that the physical composition of the layer 14 gradually changes from that of the substrate 12 to a different composition at the surface 14a.

Figure 6:
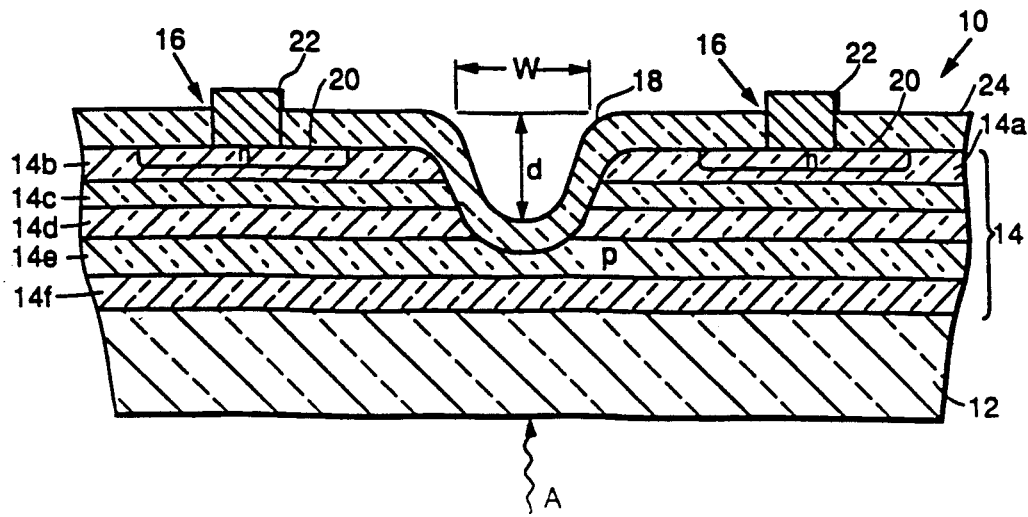
FIG. 6 is a cross-sectional view (not to scale) of a portion of a radiation detecting array similar to that shown in FIG. 1b having a superlattice spacing in the photodetecting material that varies from its bottom to top surface.

This compositional grading may be achieved in a known fashion by providing a continuous variation of a semiconductor alloy composition during growth or by modifying the composition after growth by, for example, a diffusion process. This compositional grading can also be achieved by varying a spacing within a superlattice the bottom surface and the top surface of the layer to vary the effective bandgap composition. This is shown representionally in FIG. 6, which is similar to FIG. 1b, with layers 14b-14f representing the varying spacing within the superlattice of photodetecting material 14.

As can be seen in FIG. 3 such a compositionally graded layer causes a reduction of the energy bandgap at the surface as compared to the energy bandgap at the substrate interface. This lowering of the energy bandgap also beneficially causes the charge carriers, indicated by the letters "CC", to be constrained to exist within the upper surface 14a region of the layer 14. By example, a p-type semiconductor's alloy composition is varied in a regular fashion through the thickness of the detector material film, such that the bandgap at the surface is narrower than the bandgap at the substrate interface. As a result, photoexcited charge carriers, in this case electrons, experience a crystal potential field which tends to constrain them to exist in a region substantially adjacent to the surface 14a. This confinement of the charge carriers near the surface 14a makes the relatively shallow groove 18 more effective in blocking the diffusion of photoexcited minority carriers. It should be noted that the groove 18 is not etched completely through the layer 14 to the substrate 12 in order to preserve the electrical continuity of the layer 14 across the array 10. As a result, a voltage potential applied to the layer 14 is experienced in common by all of the photodiodes of the array while providing the beneficial effect of the isolating groove structures between adjacent photodiodes.

In fabricating the layer 14 as a compositionally graded layer having a bandgap energy distribution as shown in FIG. 3 the groove 18 is formed to a depth "d" which is less than the thickness "T" of the layer 14. Minority charge carriers generated by the radiation are constrained to move within diffusion paths located within the upper region of the layer 14 and generally above the lowest portion of the groove 18, thereby effectively isolating the charge carriers formed within one region from diffusing to an adjacent active region. This is accomplished without physically etching completely through the layer 14, thereby providing for the layer 14 to be electrically at one potential. The depth "d" has a value which is a function of the degree of effective bandgap grading of the layer 14 and other parameters such as the detector temperature. In general, the depth "d" is approximately equal to 50% of the layer 14 thickness "T". The width (W) can be equal to "d" or may be significantly less than "d".

In general, the depth "d" is such that the crystal potential field which a minority carrier would have to diffuse against, in order to pass under the groove 18 and into an adjacent detector region, is on the order of kT or greater, where k is Boltzmann's constant and T is the detector temperature.

Returning to FIGS. 1a and 1b each of the active regions 16 can be seen to include an n-type region 20 having an associated electrical terminal 22. Each of the n-type regions 20 forms a p-n junction with the adjacent p-type material of the layer 14. Of course, in other embodiments the layer 14 can be n-type and the individual regions p-type.

In an embodiment of the invention the p-n junctions are reduced in area relative to the area defined by the intersecting grooves and do not occupy all or substantially all of this area. The junctions are reduced in area in order to beneficially minimize junction capacitance and maximize junction impedance. Such a reduced area p-n junction is surrounded by a relatively larger "inactive" area. Charge carriers diffuse into the inactive area and may exist there for a significant amount of time before being collected by the depletion region associated with and surrounding the p-n junction.

The regions 20 can be, by example, implanted or diffused regions. Alternatively regions 20 may be grown over or into the surface 14a and defined by selective growth or etching. A passivation layer 24 is typically applied to the upper surface 14a, the passivation layer also being applied to the surface of the groove 18 to reduce surface recombination loss of photocarriers. The groove 18 is formed by a processing step such as a chemical etch or ion beam etch which is accomplished through a suitably patterned mask. The layer 14 can be formed by a process such as MOCVD or VPE wherein the composition of the source elements is varied during growth in order to achieve the desired compositional grading of the layer 14.

By example, the layer 14 is comprised of $Hg_xCd_{(1-x)}Te$ where x varies from approximately 0.9 near the substrate 12 to approximately 0.2 to approximately 0.3 at the surface 14a. The thickness of the layer 14 is approximately 10 microns while the width (W) and the depth (d) of the groove 18 are each approximately five microns. Of course, other material compositions and dimensions are within the scope of the teaching of the invention. The groove 18 may partially or wholly surround each active detector region 16. In the case where the groove 18 only partially surrounds an active detector region 16 the groove 18 is combined with other structure, such as a ground plane or guard diode, to control optical crosstalk in a particular direction.

Figure 5:
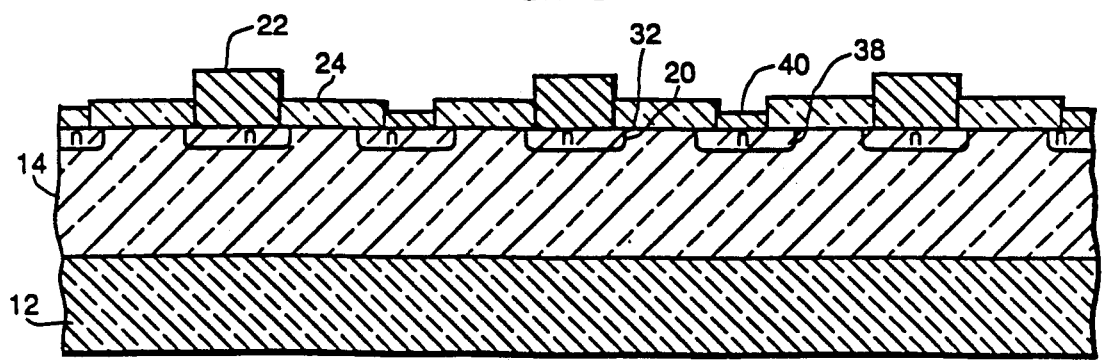
FIG. 5 is a cross-sectional view (not to scale) of the portion of a radiation detector array similar to that shown in FIG. 4 having a plurality of guard diodes 40 disposed along a first axis and interposed between active regions, along with electrical terminals therefor.

For example, and referring to FIG. 2, and FIG. 4 there is shown a top view and cross-section view, respectively, (not to scale) of a portion of a radiation detecting array 30 having a compositionally graded photodetecting layer and a plurality of detector column ground planes 34 disposed along a first, y-axis and interposed between active regions 32. The array 30 also includes a plurality of grooves 36, as previously described, disposed along a second, x-axis axis. In this embodiment of the invention crosstalk is controlled in the x-direction by means of the ground planes 34 while crosstalk is controlled in the y-dimension by the plurality of grooves 36. If desired the ground planes 34 may be replaced with guard diodes 38 with electrical terminals 40 to achieve the same function, as shown in FIG. 5.

While the invention has been particularly shown and described with respect to a preferred embodiment thereof, it will be understood by those skilled in the art that changes in form and details may be made therein without departing from the scope and spirit of the invention.

What is claimed is:

1. An array of photodetecting active regions comprising a layer of photoresponsive material differentiated into a plurality of said photodetecting active regions, said layer having a composition which varies across a thickness of said layer from a first surface of said layer to a second surface of said layer such that a magnitude of an effective energy bandgap of said layer decreases from the first surface to the second surface for constraining charge carriers to exist within a region of said layer which is substantially adjacent to said second surface, said array including a plurality of groove structures formed within the second surface of said layer and extending into said layer to a predetermined depth which is less than the thickness of said layer, individual ones of said groove structures being interposed between at least two adjacent ones of said active regions for substantially preventing minority carriers from laterally diffusing from one of the active regions to an adjacent one of the active regions.

2. An array as set forth in claim 1 wherein the thickness is within a range of approximately one micron to 100 microns and wherein the predetermined depth of the grooves is at least approximately one half of the thickness of said layer.

3. An array as set forth in claim 1 wherein the predetermined depth is such that a crystal potential field which a minority carrier must diffuse against in order to pass under the groove structure is on the order of kT or greater, where k is Boltzmann's constant and T is temperature.

4. An array as set forth in claim 1 wherein said layer is comprised of Group II-VI material having a first type of electrical conductivity and wherein each of said active regions includes a region having an opposite type of electrical conductivity for defining a p-n photodiode junction.

5. An array as set forth in claim 1 wherein said layer is comprised of p-type $Hg_xCd_{1-x}Te$ and wherein the value of x varies from 0.9 at the bottom surface of the layer to approximately 0.2 or 0.3 at the top surface of the layer.

6. An array as set forth in claim 1 wherein said layer is comprised of a superlattice wherein the superlattice spacing is varied between the bottom surface and the top surface of the layer to vary the effective bandgap composition.

7. An array as set forth in claim 1 wherein said layer is comprised of Group III-V material having a first type of electrical conductivity and wherein each of said active regions includes a region having an opposite type of electrical conductivity for defining a p-n photodiode junction.

8. An array as set forth in claim 1 and further comprising a plurality of elongated ground plane structures disposed upon the second surface, individual ones of said ground plane structures being interposed between adjacent ones of said active regions, adjacent ones of said ground plane structures being substantially parallel one to another and having at least one of said groove structures disposed perpendicularly therebetween.

9. An array as set forth in claim 1 and further comprising a plurality of elongated guard diode structures disposed upon the second surface, individual ones of said guard diode structures being interposed between adjacent ones of said active regions, adjacent ones of said guard diode structures being substantially parallel one to another and having at least one of said groove structures disposed perpendicularly therebetween.

10. An array as set forth in claim 1 wherein each of said photodetecting active regions is comprised of a p-n junction having a junction area selected to reduce a capacitance and increase an impedance associated with the junction.

11. An array of radiation responsive photodiodes comprising:
    a substrate;
    a layer of radiation absorbing semiconductor material having a first electrical conductivity disposed upon a surface of said substrate, said layer generating minority charge carriers from absorbed radiation, said layer being comprised of compositionally graded material such that said layer has a first energy bandgap at a first surface adjacent to the surface of said substrate and a second, narrower energy bandgap at a second surface opposite the first surface, the narrower energy bandgap of the second surface constraining a lateral diffusion of the charge carriers to occur within a region substantially adjacent to said second surface, said layer further including a plurality of regions having an opposite type of conductivity for forming a plurality of p-n junctions for collecting said minority charge carriers; and
    a plurality of groove structures formed within the second surface of said layer and extending into said layer to a depth which is less than a thickness of said layer, individual ones of said groove structures being interposed between at least two adjacent ones of said p-n junctions for substantially preventing a charge carrier from laterally diffusing from within an area surrounding one of said p-n junctions to an area surrounding another one of said p-n junctions.

12. An array as set forth in claim 11 wherein the thickness of said layer is within a range of approximately one micron to approximately 100 microns and wherein the depth of the groove structure is at least approximately one half of the thickness of said layer.

13. An array as set forth in claim 11 wherein the depth of the groove structure is such that a crystal potential field which a minority charge carrier must diffuse against in order to pass under the groove structure is on the order of kT or greater, where k is Boltzmann's constant and T is temperature.

14. An array as set forth in claim 11 wherein said layer is comprised of Group II-VI material.

15. An array as set forth in claim 14 wherein said layer is comprised of $Hg_xCd_{(1-x)}Te$ and wherein the value of x varies from approximately 0.9 at the bottom surface of the layer to approximately 0.2 to approximately 0.3 at the top surface of the layer.

16. An array as set forth in claim 11 wherein said layer is comprised of a superlattice wherein the superlattice spacing is varied between the bottom surface and the top surface of the layer to vary the effective bandgap composition.

17. An array as set forth in claim 11 and further comprising a plurality of elongated ground plane structures disposed upon the second surface, individual ones of said ground plane structures being interposed between adjacent ones of said p-n junctions, adjacent ones of said ground plane structures being substantially parallel one to another and having at least one of said groove structures disposed perpendicularly therebetween.

18. An array as set forth in claim 11 and further comprising a passivation layer overlying the second surface of said layer and exposed surfaces of said groove structure.

19. An array as set forth in claim 11 wherein said layer is electrically continuous across said array.

20. An array as set forth in claim wherein each of said p-n junctions has a junction area selected to reduce a capacitance and increase an impedance associated with the junction.

21. An array as set forth in claim 11 and further comprising a plurality of elongated guard diode structures disposed upon the second surface, individual ones of said guard diode structures being interposed between adjacent ones of said active regions and having at least one of said groove structures disposed substantially perpendicularly therebetween.

* * * * *